United States Patent [19]

Besso

[11] Patent Number: 4,937,278

[45] Date of Patent: Jun. 26, 1990

[54] POLYMETHYLPENTENE RELEASE SHEET

[75] Inventor: Erica M. Besso, 25 Long Island Road, Manotick, Ontario, Canada, K0A 2N0

[73] Assignee: Erica Marie-Jose Besso, Manotick, Canada

[21] Appl. No.: 330,875

[22] Filed: Mar. 30, 1989

[30] Foreign Application Priority Data

Apr. 5, 1988 [CA] Canada ................................... 563299

[51] Int. Cl.$^5$ ................................................ C08K 5/04
[52] U.S. Cl. .................................... 524/398; 524/401; 524/413; 524/394; 524/579
[58] Field of Search ................. 524/401, 413, 394, 398

[56] References Cited

U.S. PATENT DOCUMENTS 2,705,227 3/1955 Stamatoff .
4,269,884 5/1981 Della Vecchia .................... 428/303

FOREIGN PATENT DOCUMENTS 53-136084 11/1978 Japan .
55-042839 3/1980 Japan .

OTHER PUBLICATIONS

U.S. Appln. No. 07/266878, filed 11/2/88.

Primary Examiner—Joseph L. Schofer
Assistant Examiner—Mark D. Sweet

[57] ABSTRACT

A release sheet, comprising poly-4-methylpentene-1 film containing a copper salt of an alkanoic acid and at least one of an alkali metal halide and an alkaline earth metal halide, is disclosed. Such film is useful as a release sheet in the manufacture of printed circuit boards.

10 Claims, No Drawings

POLYMETHYLPENTENE RELEASE SHEET

The present invention relates to the manufacture of printed circuit boards from polyimide and epoxy prepregs. The term "prepreg" is known in the art as meaning a reinforcement material impregnated with resin which has undergone a partial cure. This prepreg, also known as B-stage, contains resin in a metastable state. Printed circuit boards comprise laminates of such prepregs which have been subjected to a final cure.

A printed circuit board may comprise a copper foil adhered to a cured prepreg. Optionally, the copper foil may be on both sides of the cured prepreg. Several processes are known for the manufacture of printed circuit boards. For example, "books" of a multiplicity of layers of copper foil, glass-reinforced epoxy prepreg or glass-reinforced polyimide prepreg and a release sheet are placed between stainless steel sheets having mirror surfaces, and pressed together in a hydraulic press at an elevated temperature. In another process the "book" is placed in a bag which is evacuated and the whole is autoclaved. Processes such as these, and others, are disclosed, for example in Japanese Unexamined Kokai No. 53136084 to Fujitsu Ltd. and Japanese Unexamined Kokai No. 55042839 to Toshiba Chemical K.K. The function of the release film in this application is two-fold. The first is to prevent resin from adhering to the stainless steel sheets. The second is to prevent the individual circuit boards within a book from being bound together via the resin which may be squeezed out at their perimeters.

When release sheets are used in such processes, it is desirable that the sheet be able to be stripped away, easily, from the cured glass-reinforced polyimide or epoxy resin, without shredding. It is important, therefore that the release sheet not be degraded or embrittled during the time that the prepreg is being cured, at elevated temperatures. For epoxy prepregs, curing usually takes place at about 175° C. for 1 hour. For polyimide prepregs, curing usually takes place at about 220° for 2 hours. Release sheets that have been used in the manufacture of printed circuit boards from polyimide and epoxy prepregs include cellulose acetate films, fluorinated films, and polyester films. Some of these films, however, have a tendency to shatter upon being pulled from the cured epoxy resin. Poly-4-methylpentene-1 film is also useful in this application, but it is known to suffer from shortcomings. Firstly, the film suffers from the presence of gel particles which cause a pitted or uneven surface to be formed in the printed circuit boards. Secondly, the film becomes embrittled when used at the higher cure temperatures typical for polyimides. A means of minimizing these problems has now been found.

Accordingly, the present invention provides a process for the manufacture of printed circuit boards from polyimide or epoxy prepregs, wherein a release sheet is used in such manufacture, the improvement wherein the release sheet is a poly-4-methylpentene-1 film containing (a) a copper salt of alkanoic acid and (b) at least one of an alkali metal halide and an alkaline earth metal halide.

Preferably the copper salt is selected from copper salts of acetic, butyric, lauric, palmitic or stearic acids, especially cupric acetate.

Preferably the metal halide is an alkali metal halide, especially sodium and potassium bromides and iodides.

The copper salts are preferably in a concentration of from 0.001 to 0.05 wt. %, especially 0.002 to 0.1 wt. %, and the halides are preferably in a concentration of from 0.1 to 0.5 wt. %, especially 0.02 to 0.1 wt. %.

The copper salts and metal halides must be added to the film prior to extrusion or with the precursors to the polymer.

The invention also provides a release sheet comprising a poly-4-methylpentene-1 film containing (a) a copper salt of an alkanoic acid and (b) at least one of an alkali metal halide and an alkaline earth metal halide.

Preferably the copper salt is selected from copper salts of acetic, butyric, lauric, palmitic or stearic acids, especially cupric acetate.

Preferably the metal halide is an alkali metal halide, especially sodium and potassium bromides and iodides.

The copper salts are preferably in a concentration of from 0.001 to 0.05 wt. %, especially 0.002 to 0.01 wt. %, and the metal halides are preferably in a concentration of from 0.01 to 0.5 wt. %, especially 0.02 to 0.1 wt. %.

The film of the present invention, useful as a release sheet, may be extruded as a flat sheet.

In use, "books" comprising several layers of copper roll, glass reinforced polyimide or epoxy prepreg and release shoot are formed in the manner described hereinafter. Optionally there may be a second copper foil between the prepreg and the release sheet. The number of "sandwiches" stacked to form a book varies according to the equipment being used, and the number of circuit boards required.

In one process the book is placed in a hydraulic press with steel plates ("press plates") on both sides of the book. The press plates are heated to the required temperature. For epoxy prepregs, the assembly is usually heated to temperatures from 150° to 200°, usually 175° C. for a period of 50 to 75 mins., usually about 60 mins., in order to cure the epoxy resin. For polyimide prepregs, the assembly is heated to temperatures from 200° to 250°, usually about 220° C., for a period of from 100 to 150 mins. After cooling the book and removing it from the press, the printed circuit boards may be separated. With printed circuit boards having copper foil on both sides of the glass-reinforced resin, release sheets are also required because the molten material oozes from the edges of the circuit board. In another process the book is placed between steel plates, placed in a heat-stable bag, and the bag is evacuated to a pressure of about 150 kPa. The evacuated bag, containing the book is placed in an autoclave and the prepreg is cured at temperatures and times similar to those for the other process described hereinabove.

The invention may be illustrated by reference to the following Example.

EXAMPLE 1

Several compositions of poly-4-methylpentene-1, containing cupric acetate and potassium bromide were cast into film form, using a Welding Engineers (trade mark) 53 mm twin-screw extruder. Two grades of poly-4-methylpentene-1 were used i.e. TPX (trade mark) DX-845 and TPX MX-004, with malt indices of 8 and 26 at 260° C., respectively. The concentrations of cupric acetate were from 20 to 100 ppm wt Cu. The concentrations of potassium bromide were from 200 to 1000 ppm wt. halide. A film, containing cupric acetate (30 ppm Cu) and 300 ppm potassium bromide was used as a release sheet in curing a polyimide prepreg. The prepreg was cured at 220° C. for 2 hours and the film showed good release properties after completion of the cure cycle.

I claim:

1. A release sheet comprising a poly-4-methylpentene-1 film containing (a) a copper salt of an alkanoic acid and (b) at least one of an alkali metal halide and an alkaline earth metal halide.

2. A release sheet according to claim 1 wherein the copper salt is selected from the copper salts of acetic, butyric, lauric, palmitic and stearic acids.

3. A release sheet according to claim 1 wherein the copper salt is present in a concentration of from 0.001 to 0.5 wt. %.

4. A release sheet according to claim 2 wherein the copper salt is present in a concentration of from 0.001 to 0.05 wt. %.

5. A release sheet according to claim 2 wherein the sheet contains an alkali metal halide.

6. A re lease sheet according to claim 5 wherein the sheet contains at least one of sodium bromide, sodium iodide, potassium bromide and potassium iodide.

7. A release sheet according to claim 3 wherein the halide is present in a concentration of from 0.01 to 0.5 wt. %.

8. A release sheet according to claim 5 wherein the halide is present in a concentration of from 0.01 to 0.5 wt. %.

9. A release sheet comprising a poly-4-methylpentene-1 film containing from 0.001 to 0.05 wt. % cupric acetate and from 0.01 to 0.5 wt. % potassium bromide.

10. A release sheet according to claim 9 wherein the cupric acetate is present in a concentration of from 0.002 to 0.01 wt. % and the potassium bromide is present in a concentration of from 0.02 to 0.1 wt. %.

* * * * *

UNITED STATES PATENT AND TRADEMARK OFFICE
CERTIFICATE OF CORRECTION

PATENT NO.   :   4,937,278

DATED        :   June 26, 1990

INVENTOR(S)  :   Erica Marie-Jose Besso

It is certified that error appears in the above-identified patent and that said Letters Patent is hereby corrected as shown below:

Claim 3, Column 3, line 15, delete the figure "0.5" and insert in its place -- 0.05 --.

Signed and Sealed this

Seventeenth Day of December, 1991

Attest:

HARRY F. MANBECK, JR.

*Attesting Officer*     *Commissioner of Patents and Trademarks*